US010602608B2

(12) United States Patent
Sugiyama et al.

(10) Patent No.: US 10,602,608 B2
(45) Date of Patent: *Mar. 24, 2020

(54) CIRCUIT BOARD

(71) Applicant: TAIYO YUDEN CO., LTD., Tokyo (JP)

(72) Inventors: Yuichi Sugiyama, Tokyo (JP); Masashi Miyazaki, Tokyo (JP); Yutaka Hata, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/107,233

(22) Filed: Aug. 21, 2018

(65) Prior Publication Data

US 2019/0069397 A1 Feb. 28, 2019

(30) Foreign Application Priority Data

Aug. 22, 2017 (JP) .................................. 2017-159301
Aug. 22, 2017 (JP) .................................. 2017-159302

(51) Int. Cl.
*H05K 1/02* (2006.01)
*H01L 27/146* (2006.01)

(52) U.S. Cl.
CPC ......... *H05K 1/0278* (2013.01); *H05K 1/0204* (2013.01); *H05K 1/0271* (2013.01); *H05K 1/0281* (2013.01); *H01L 27/14636* (2013.01); *H05K 2201/068* (2013.01); *H05K 2201/09972* (2013.01); *H05K 2201/10121* (2013.01)

(58) Field of Classification Search
CPC .. H05K 1/0278; H05K 1/0271; H05K 1/0204; H05K 1/0281; H05K 1/14636
See application file for complete search history.

(56) References Cited

U.S. PATENT DOCUMENTS 4,917,613 A * 4/1990 Kabadi .................. H01R 12/62
439/457
5,093,761 A 3/1992 Ozaki
(Continued)

FOREIGN PATENT DOCUMENTS

JP H1-63136 U 4/1989
JP 2006-222182 A 8/2006
(Continued)

OTHER PUBLICATIONS

U.S. Appl. No. 16/107,214, filed Aug. 21, 2018.
(Continued)

*Primary Examiner* — William Coleman
(74) *Attorney, Agent, or Firm* — Chen Yoshimura LLP

(57) ABSTRACT

A circuit board includes a flexible wiring board with a reinforcing member. The flexible wiring board has a first, second and third sections. The reinforcing member is embedded in a cavity in the first section of the wiring board, and is sandwiched by a pair of resin layers provided below and above. A pair of wiring layers are disposed on the pair of the resin layers, respectively. The metal reinforcing member has either a plate shape or a frame shape. The first section of the wiring board is positioned closer to one of the wiring layers than to another of the wiring layers in a vertical direction.

10 Claims, 4 Drawing Sheets

(56) References Cited

U.S. PATENT DOCUMENTS

| | | | | |
|---|---|---|---|---|
| 5,669,775 | A * | 9/1997 | Campbell | H05K 1/189 439/77 |
| 7,067,912 | B2 | 6/2006 | Takeuchi et al. | |
| 8,853,549 | B2 * | 10/2014 | Kato | H05K 1/0281 156/308.2 |
| 8,884,164 | B2 * | 11/2014 | Chen | H05K 1/09 174/254 |
| 9,405,116 | B2 * | 8/2016 | Khechana | B81C 3/005 |
| 9,854,685 | B2 * | 12/2017 | Ikemoto | H04N 5/2257 |
| 2010/0126760 | A1 * | 5/2010 | Ishikawa | H04N 5/2253 174/260 |
| 2011/0019383 | A1 | 1/2011 | Aoyama et al. | |
| 2011/0194262 | A1 | 8/2011 | Naganuma et al. | |
| 2011/0198111 | A1 | 8/2011 | Naganuma et al. | |
| 2011/0199739 | A1 | 8/2011 | Naganuma et al. | |
| 2011/0203837 | A1 | 8/2011 | Naganuma et al. | |
| 2014/0326487 | A1 | 11/2014 | Ozeki et al. | |
| 2016/0007444 | A1 | 1/2016 | Watanabe et al. | |
| 2016/0066429 | A1 * | 3/2016 | Taniguchi | H05K 1/0278 361/749 |
| 2017/0290145 | A1 | 10/2017 | Tajima et al. | |
| 2017/0374735 | A1 | 12/2017 | Suganuma et al. | |
| 2019/0069398 | A1 * | 2/2019 | Sugiyama | H05K 1/0281 |

FOREIGN PATENT DOCUMENTS

| | | |
|---|---|---|
| JP | 2009-189186 A | 8/2009 |
| JP | 2010-45155 A | 2/2010 |
| JP | 2011-108929 A | 6/2011 |
| WO | 2013/190748 A1 | 12/2013 |

OTHER PUBLICATIONS

Japanese Office Action dated Jun. 18, 2019, in a counterpart Japanese patent application No. 2017-159302. (A machine translation (not reviewed for accuracy) attached.).

Japanese Office Action dated Jun. 18, 2019, in a counterpart Japanese patent application No. 2017-159301. (Cited in the related U.S. Appl. No. 16/107,214. A machine translation (not reviewed for accuracy) attached.).

Japanese Office Action dated Feb. 4, 2020, in a counterpart Japanese patent application No. 2017-159302. (A machine translation (not reviewed for accuracy) attached.).

* cited by examiner

CIRCUIT BOARD

BACKGROUND OF THE INVENTION

Technical Field

The present invention relates to a circuit board having a flexible section and a rigid section.

Background Art

The demands for electronic devices have become more diverse as the information and communication industry has expanded, and the need for speeding up development and the start of mass production has also increased. In particular, in addition to the basic function as a phone, various functions have been added to smartphones, such as the internet, electronic mail, cameras, GPS, wireless LAN, and one segment TV, and there has also been an increase in the number of types of smartphones. Improvements in battery capacity have become an issue for high-functionality smartphones, with progress being made on higher density mounting on main boards, making smartphones smaller and thinner, and modularizing functional blocks. Among these, there is demand to make modules mounted in smartphones thinner, which includes improvements in methods for joining the modules to the main board.

In order to realize multi-functionality and thinning of components, there is demand that module substrates used in mobile devices such as smartphones be made even thinner. More specifically, when using a flexible substrate or the like to connect a main board and a module, while a method of using a connector and a method of bonding a module substrate and a flexible substrate are well-known, and decreasing the mounting area and increases in the overall thickness of the module have become issues. Thus, the use of composite circuit boards (rigid-flexible substrates) that provide a rigid section in a flexible substrate has been moving forward.

For example, Patent Document 1 discloses a circuit board that includes: a deformable flexible section; a rigid section that includes an insulating base material and an electric circuit formed on the insulating base material, and to which the flexible section is connected; and a reinforcing member that is formed at a periphery of the insulating base material, imparts internal stress on the insulating base material, and is formed with an insulating resin that is more rigid than the insulating base material.

RELATED ART DOCUMENT

Patent Document

Patent Document 1: Japanese Patent Application Laid-Open Publication No. 2011-108929

SUMMARY OF THE INVENTION

In recent years, in fields, such as camera modules, for example, in which further thinning is in demand, there has been demand for the development of circuit boards which have a very strong rigid section and excellent heat-dissipating properties, and in which it is possible to increase the density of the wiring patterns. However, in a configuration in which a reinforcing section is provided at a periphery of the rigid section, there is a problem in that the strength of the in-plane center of the rigid section is weak compared to the periphery of the rigid section, and the heat-dissipating properties are not satisfactory. Accordingly, the present invention is directed to a scheme that substantially obviates one or more of the problems due to limitations and disadvantages of the related art.

In view of the above-mentioned issues, an object of the present invention is to provide a circuit board that is able to increase the density of wiring patterns while improving the heat-dissipating properties and the strength of the rigid section.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a circuit board, including: a flexible wiring board having a plurality of layers laminated therein, including wiring layers and insulating layers, the wiring board having three sections arranged in a lengthwise direction of the wiring board: a first section in one end, a second section in a middle, and a third section in another end, the first section having a cavity or cutout in a plan view, a metal reinforcing member embedded in the cavity or cutout of the wiring board in the first section; a first resin layer that is formed on a bottom surface of the wiring board in the first section and that is selectively formed on a bottom of the reinforcement member, the first resin layer being absent on the wiring board in the second and third sections; a second resin layer that is formed on a top surface of the wiring board in the first section and that selectively covers a top surface the reinforcement member, the second resin layer being absent on the wiring board in the second and third sections; a first wiring layer that is provided on the first resin layer and that is electrically connected to the wiring board in the first section; and a second wiring layer that is provided on the second resin layer and that is electrically connected to the wiring board in the first section, wherein the metal reinforcing member has one of a plate shape and a frame shape in the plan view, and wherein the first section of the wiring board is positioned closer to the first wiring layer than to the second wiring layer in the vertical direction.

In another aspect, the present disclosure provides a circuit board, including: a flexible wiring board having a plurality of layers laminated therein, including wiring layers and insulating layers, the wiring board having three sections arranged in a lengthwise direction of the wiring board: a first section in one end, a second section in a middle, and a third section in another end, the first section having a cavity or cutout in a plan view, a metal reinforcing member embedded in the cavity or cutout of the wiring board in the first section; a first resin layer that is formed on a bottom surface of the wiring board in the first section and that is selectively formed on a bottom of the reinforcement member, the first resin layer being absent on the wiring board in the second and third sections; a second resin layer that is formed on a top surface of the wiring board in the first section and that selectively covers a top surface the reinforcement member, the second resin layer being absent on the wiring board in the second and third sections; a third resin layer between the top surface of the metal reinforcing member and the second resin layer, the third resin layer being formed of a resin material having a smaller coefficient of thermal expansion than the second resin layer; a first wiring layer that is provided on the first resin layer and that is electrically connected to the wiring board in the first section; a second wiring layer that is provided on the second resin layer and that is electrically connected to the wiring board in the first section; a third resin layer that is formed on a bottom surface of the wiring board in the third section, the third resin layer being absent on the wiring board in the first and second sections; a fourth resin layer that is formed on a top surface of the wiring board in the third section, the fourth resin layer being absent on the wiring board in the second and third sections; a third wiring layer that is provided on the third resin layer and that is electrically connected to the wiring board in the third section; and a fourth wiring layer that is provided on the fourth resin layer and that is electrically connected to the wiring board in the third section, wherein the metal reinforcing member has one of a plate shape and a frame shape in the plan view, and wherein the first section of the wiring board is positioned closer to the first wiring layer than to the second wiring layer in a vertical direction.

In another aspect, the present disclosure provides a circuit board that includes a flexible wiring base board and a reinforcing section.

The flexible wiring base board has a first end that has a first primary surface and a second primary surface that are orthogonal to a thickness direction, and a second end opposite of the first end.

The reinforcing section has a first resin layer, a second resin layer, a first mounting surface, a second mounting surface, and a metal reinforcing member that has one of a plate shape and a frame shape. The first resin layer selectively covers the first primary surface of the first end. The second resin layer selectively covers the second primary surface of the first end. The first mounting surface has a first wiring layer that is provided on the first resin layer and that is electrically connected to the flexible wiring base board. The second mounting surface has a second wiring layer that is provided on the second resin layer and that is electrically connected to the flexible wiring base board. The reinforcing member is embedded in the first end.

The first end is disposed closer to the first mounting surface than the second mounting surface.

In the circuit board, since the reinforcing section has the plate-shaped or frame-shaped reinforcing member embedded in the first end, it is possible to improve the heat-dissipating properties and the strength of the reinforcing section while satisfying the thickness demands. Moreover, since the first end of the flexible wiring base board is disposed closer to the first mounting surface than to the second mounting surface, it becomes possible to make the diameter and length of an interlayer connecting section of the second wiring layer that is connected to the first end relatively small, and it is therefore possible to increase the density of the wiring patterns.

The first end may have one of a recess with a bottom and a recess without a bottom, and the reinforcing member may be disposed in the recess.

As a result, it is possible to easily embed the reinforcing member in the first end of the flexible wiring base board.

The reinforcing member may be electrically connected to the circuit.

In such a case, the reinforcing member can be used as a portion of the wiring.

The reinforcing section may further include a third resin layer. The third resin layer is provided between the second primary surface and the second resin layer, and is formed of a resin material having a coefficient of thermal expansion that is smaller than the second resin layer.

As a result, it is possible to increase the flatness of the rigid section by suppressing warping of the reinforcing section.

The circuit board may further include an imaging element. The imaging element is mounted on the first mounting surface and is electrically connected to the circuit.

Since the first end is disposed closer to the first mounting surface side, it is possible to realize an increase in the density of a wiring pattern that is able to correspond to a terminal alignment pitch of the imaging element.

The reinforcing member may be disposed closer to the first mounting surface than the second mounting surface. As a result, it is possible to increase the heat-dissipating efficiency of electronic components mounted on the first mounting surface.

As mentioned above, according to the present invention, it is possible to increase the density of wiring patterns while improving the heat-dissipating properties and the strength of the rigid section.

It is to be understood that both the foregoing general description and the following detailed description are exemplary and explanatory, and are intended to provide further explanation of the invention as claimed.

BRIEF DESCRIPTION OF THE DRAWINGS

FIG. 3 is a schematic cross-sectional view that shows a configuration example of an electronic device in which the circuit board has been built in.

DETAILED DESCRIPTION OF EMBODIMENTS

Embodiments of the present invention will be described below with reference to the drawings.

Embodiment 1

Figure 1:
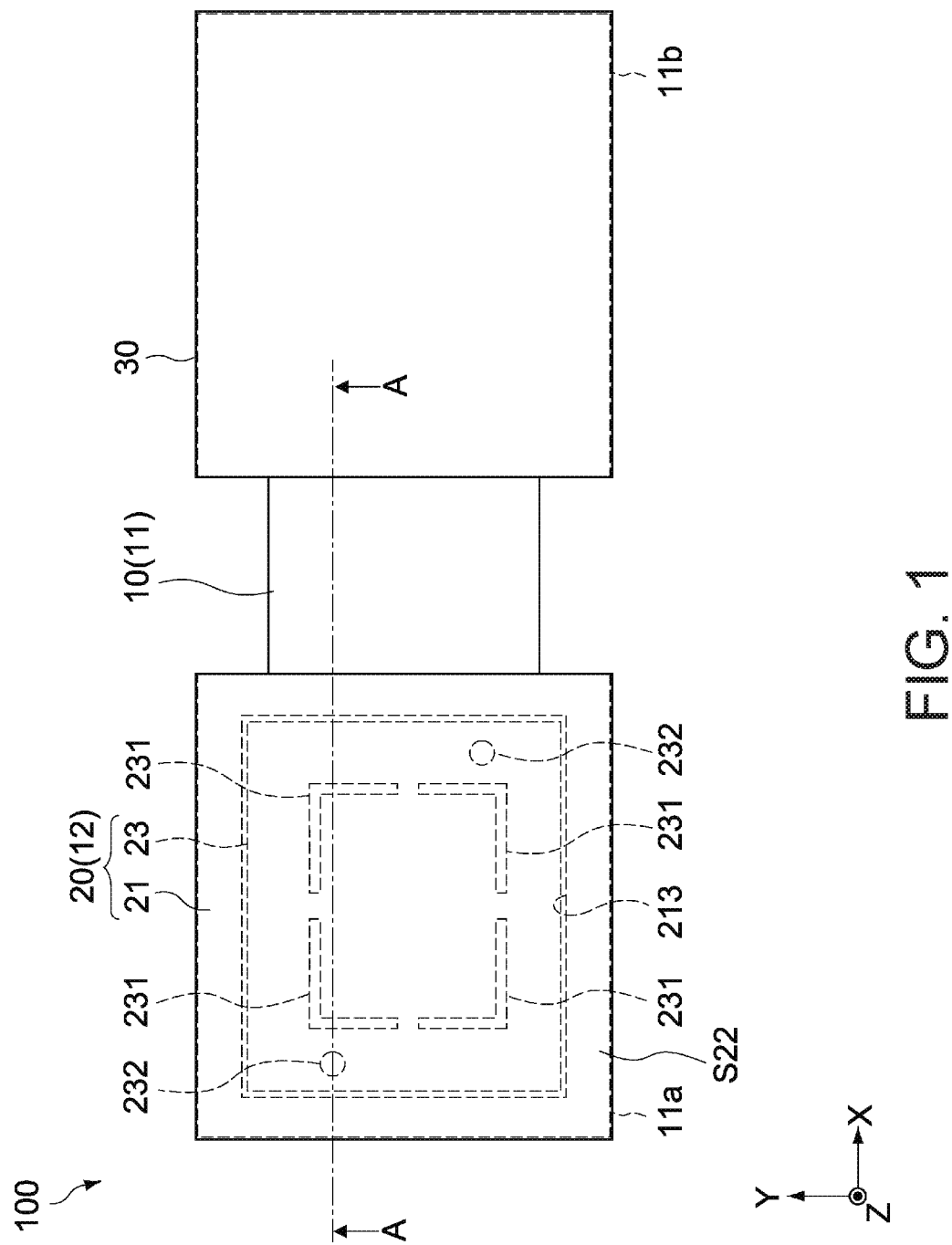
FIG. 1 is a schematic plan view that shows a configuration of a circuit board according to Embodiment 1 of the present invention.
Figure 2:
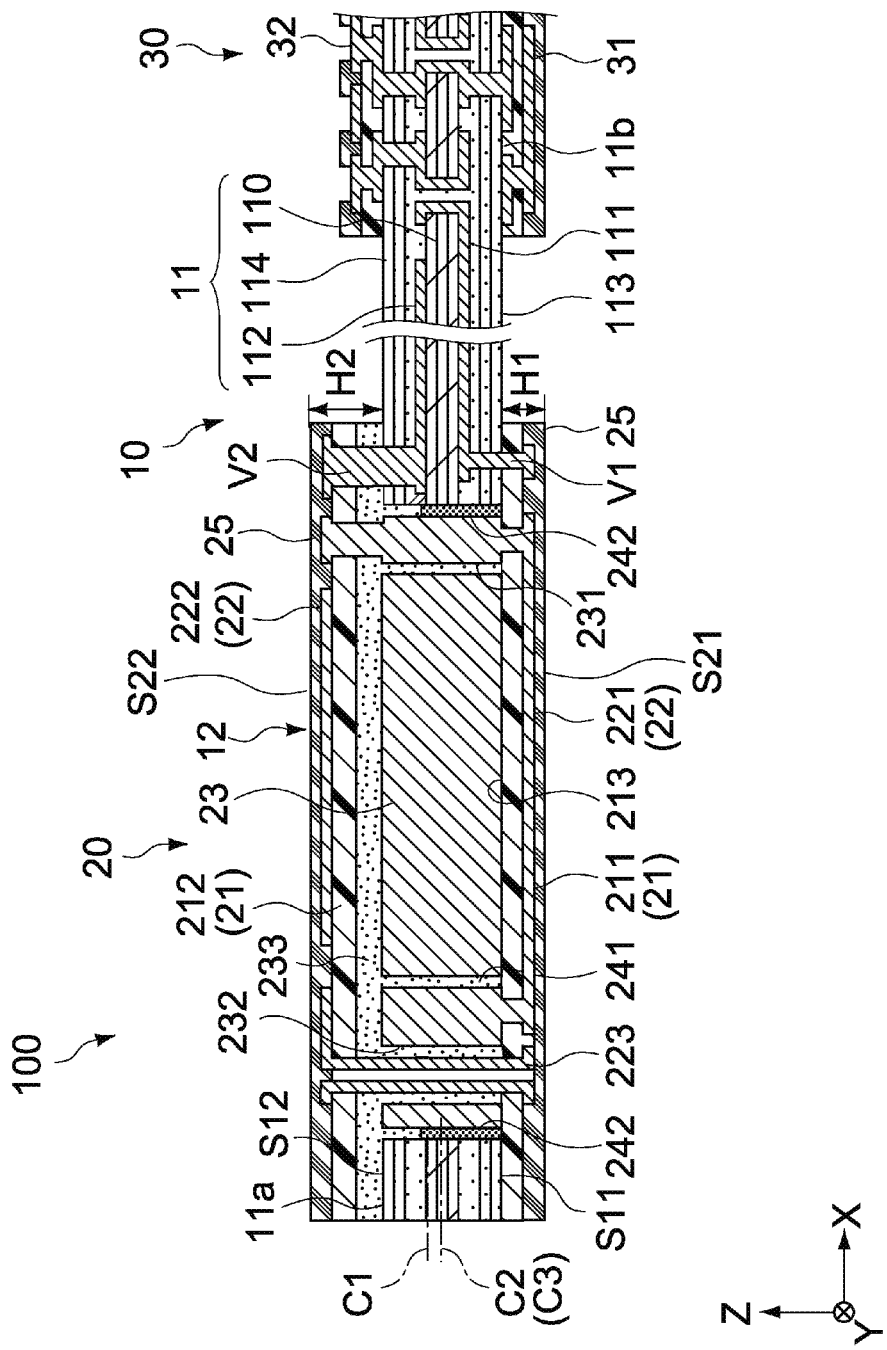
FIG. 2 is a cross-sectional view in a line A-A direction in FIG. 1.

FIG. 1 is a schematic plan view that shows a configuration of a circuit board according to Embodiment 1 of the present invention. FIG. 2 is a cross-sectional view in a line A-A direction in FIG. 1.

Note that, in the respective figures, the X, Y, and Z axes represent three mutually orthogonal axial directions, and the Z axis direction corresponds to a thickness direction of the circuit board.

<Circuit Board>

A circuit board 100 of the present embodiment has a first substrate main body 10 and a second substrate main body 20. The circuit board 100 is typically integrally configured with a control board 30, but may be configured as a component separate from the control board 30.

(First Substrate Main Body)

The first substrate main body 10 is formed of a flexible wiring base board 11 that connects the second substrate main body 20 and the control board 30, and forms a flexible section of the circuit board 100. The flexible wiring base board 11 typically has a lengthwise direction in the X axis direction and a width direction in the Y axis direction, and the center part in the lengthwise direction that corresponds to the first substrate main body 10 is formed so as to have a narrow width. A reinforcing section 12 is provided on one end (a first end 11*a*) in the lengthwise direction of the flexible wiring base board 11, and the control board 30 is provided on the other end (a second end 11*b*).

As shown in FIG. 2, the flexible wiring base board 11 is formed of a stacked body that includes: a resin core 110; wiring layers 111, 112 provided on both surfaces of the resin core 110; and insulating layers 113, 114 that cover the wiring layers 111, 112.

The resin core 110 is formed of a single-layer or multilayer flexible plastic film of a polyimide, polyethylene terephthalate, or the like, for example. The wiring layers 111, 112 are typically formed of a metal material such as copper or aluminum. Portions of the wiring layers 111, 112 are electrically connected to each other by means of throughholes or vias provided in appropriate locations of the resin core 110. The wiring layers of the flexible wiring base board 11 are not limited to the two layers shown in the figures, and may be one layer or three or more layers. The insulating layers 113, 114 are formed of a flexible plastic film such as a polyimide that has an adhesive layer.

The insulating layers 113, 114 form two primary surfaces that are orthogonal to the thickness direction of the flexible wiring base board 11. In FIG. 2, the insulating layer 113 forms a first primary surface S11 (the bottom face in FIG. 2) of the flexible wiring base board 11, and the insulating layer 114 forms a second primary surface S12 (the top face in FIG. 2) of the flexible wiring base board 11.

(Second Substrate Main Body)

The second substrate main body 20 includes the reinforcing section 12, which has: first and second resin layers 211, 212 that selectively cover the first end 11*a* of the flexible wiring base board 11; a circuit 22 (a first wiring layer 221 and a second wiring layer 222) provided on the first and second resin layers 211, 212; and a metal reinforcing member 23 embedded in the first end 11*a*. The second substrate main body 20 (or the reinforcing section 12) forms the rigid section of the circuit board 100.

The second substrate main body 20 is formed of a stacked body of the first end 11*a* of the flexible wiring base board 11, and the reinforcing section 12. In other words, the first end 11*a* of the flexible wiring base board 11, along with the reinforcing member 23, forms the core of the second substrate main body 20.

The first resin layer 211 selectively covers the first primary surface S11 of the first end 11*a* of the flexible wiring base board 11. The second resin layer 212 selectively covers the second primary surface S12 of the first end 11*a* of the flexible wiring base board 11. The first and second resin layers 211, 212 form the exterior of the second substrate main body 20, and the planar shape of the second substrate main body 20 is typically, as shown in FIG. 1, formed in a rectangular shape elongated in the X axis direction; however, the planar shape may be formed in a rectangular shape elongated in the Y axis direction.

The size of the first and second resin layers 211, 212 is not particularly limited; for example, the long sides may be set to 10 to 30 mm, the short sides may be set to 10 to 20 mm, and the thickness may be set to 0.2 to 0.5 mm. The thicknesses of the first and second resin layers 211, 212 are typically the same; but the present invention is not limited to this. As shown in FIG. 1, the first end 11*a* of the flexible wiring base board 11 is formed in a shape and size identical to the second substrate main body 20; however, the first end 11*a* is not limited to this, and may be formed larger or smaller than the second substrate main body 20.

The synthetic resin material forming the first and second resin layers 211, 212 is not particularly limited, and a general purpose thermosetting resin material such as an epoxy resin, a phenol resin, or a BT resin is typically used. In order to impart a desired mechanical strength, these synthetic resin materials may contain a filler (a filling material) such as glass fibers, glass cloth, or oxidized particles, for example. The first and second resin layers 211, 212 may be respectively formed using the same resin material, or may be formed using mutually different resin materials. Unless otherwise separately stated, the first and second resin layers 211, 212 are sometimes abbreviated below as the resin layers 21.

The circuit 22 includes: the first wiring layer 221; the second wiring layer 222; and an interlayer connecting section 223 that connects these wiring layers 221, 222. The first and second wiring layers 221, 222 are electrically connected to the flexible wiring base board 11 (wiring layers 111, 112) forming the first substrate main body 10 by means of via V1, V2, for example. The via V1, V2 are formed by filling openings that pass through the first and second resin layers 211, 212 with conductive paste and metal plating. These openings are formed via laser processing, etching, or the like.

The first and second wiring layers 221, 222 are respectively formed on the surfaces of the first and second resin layers 211, 212, and portions of the wiring layers 221, 222 are electrically connected to the reinforcing member 23 by means of via formed in suitable locations of the first and second resin layers 211, 212. The reinforcing member 23 may form a portion of the wiring layers, and can be used as a portion of ground wiring, for example. In addition, the reinforcing member 23 may be used as a heat-dissipating component for electronic components mounted on the second substrate main body 20.

The first and second wiring layers 221, 222 are typically formed of a cured material of a metal paste or a metal material such as copper or aluminum. The first and second wiring layers 221, 222 chiefly form connection lands for electronic components mounted on the surface of the second substrate main body 20, rewiring layers that electrically connect the electronic components to the flexible wiring base board 11, and the like. Insulating protective layers 25 such as solder resists that have openings (not shown) that expose a portion of the surface of the circuit 22 are respectively provided in appropriate locations on the surfaces of the first and second wiring layers 221, 222.

The surface of the insulating protective layer 25 covering the first wiring layer 221 forms a first mounting surface S21 (the bottom face in FIG. 2) of the reinforcing section 12, and the surface of the insulating protective layer 25 covering the second wiring layer 222 forms a second mounting surface S22 (the top face in FIG. 2) of the reinforcing section 12. The first and second mounting surfaces S21, S22 are typically configured as mounting surfaces for electronic components.

The first and second wiring layers 221, 222 are not limited to a single-layer structure, and may have a multi-layer structure. Furthermore, the present invention is not limited to the first and second wiring layers 221, 222 both being provided, and only one of these layers (the first wiring layer 221, for example) may be provided.

The reinforcing member 23 is for imparting a desired strength to the second substrate main body 20. In the present embodiment, the reinforcing member 23 is formed of a plate material disposed inside the first end 11a of the flexible wiring base board 11. The reinforcing member 23 is formed of a body that conducts electricity and heat well, and is typically formed of copper (Cu); however, the reinforcing member 23 may be alternatively formed of another metal material such as aluminum.

The planar shape of the reinforcing member 23 is not particularly limited, and the reinforcing member 23 may be formed in a rectangular plate shape that is of a size that can be housed inside the first end 11a of the flexible wiring base board 11, for example. The shape of the reinforcing member 23 is not limited to a plate shape, and may be another shape such as a frame shape or grid pattern. The size of the reinforcing member 23 is not particularly limited, with the length of each side being set to 5 to 20 mm and the thickness being set to 0.1 to 1 mm, for example. The thickness of the reinforcing member 23 is not particularly limited; in the present embodiment, the reinforcing member 23 is formed at a thickness equal to or smaller than the flexible wiring base board 11.

As shown in FIG. 1, the reinforcing member 23 is formed in a size that is able to cover substantially the entire area of the first end 11a of the flexible wiring base board 11. As a result, the reinforcing member 23 is able to effectively carry out functioning as the core of the second substrate main body 20. In addition, by housing the entire reinforcing member 23 within the first end 11a, it is possible to prevent the reinforcing member 23 from being exposed from the periphery of the first end 11a, and to ensure the insulating properties of the periphery of the second substrate main body 20. Since both surfaces of the reinforcing member 23 are covered by the first and second resin layers 211, 212, the reinforcing member 23 is prevented from being exposed from both surfaces of the second substrate main body 20.

The reinforcing member 23 is built into a housing section 213 formed in the plane of the first end 11a of the flexible wiring base board 11. The housing section 213 is constituted of a recess that does or does not have a bottom and is of a size that is able to house the reinforcing member 23. In the present embodiment, the housing section 213 is constituted of a rectangular opening that penetrates the first end 11a. As a result, it is possible to easily embed the reinforcing member 23 in the first end 11a of the flexible wiring base board 11.

In the present embodiment, the reinforcing member 23 is fixed inside the first end 11a by means of: a first insulating material 241 that fills the inside of a groove 231 formed so as to penetrate the plane of the reinforcing member 23; and a second insulating material 242 that fills the space between the outer peripheral surfaces of the reinforcing member 23 and the inner peripheral surfaces of the housing section 213. The bottom face of the reinforcing member 23 is adjacent to the first resin layer 211, and the top face of the reinforcing member 23 faces the second resin layer 212 with a third resin layer 233 formed from the first insulating material 241 therebetween.

The flexible wiring base board 11 and the reinforcing member 23 are disposed closer to the first mounting surface S21 than to the second mounting surface S22 of the reinforcing section 12. In the present embodiment, the reinforcing member 23 has a thickness identical to the flexible wiring base board 11. Therefore, a center C2 in the thickness direction of the reinforcing member 23 and a center C3 in the thickness direction of the flexible wiring base board 11 match each other, and the centers C2, C3 in the thickness directions of each of the reinforcing member 23 and the flexible wiring base board 11 are located closer to the first mounting surface S21 than a center C1 in the thickness direction of the reinforcing section 12. As a result, as shown in FIG. 2, a distance H1 between the first primary surface S11 of the flexible wiring base board 11 and the first mounting surface S21 of the reinforcing section 12 is set so as to be smaller than distance H2 between the second primary surface S12 of the flexible wiring base board and the second mounting surface S22 of the reinforcing section 12.

The reinforcing member 23 has a single or a plurality of penetrating holes 232 for forming the interlayer connecting sections 223. The penetrating holes 232 are formed at appropriate locations within the plane of the reinforcing member 23, and are provided between the periphery of the reinforcing member 23 and the formation area of the grooves 231, for example. The penetrating holes 232 are formed in circular holes of a size that can house the interlayer connecting sections 223. The interlayer connecting sections 223 are typically formed of plated copper formed so as to sandwich an insulating layer on the inner peripheral surface of the penetrating holes 232. The above-mentioned insulating layer is made of the first insulating material 241, for example.

The reinforcing section 12 further includes the third resin layer 233 that is provided between the top face S12 of the first end 11a of the flexible wiring base board 11 and the second resin layer 212. The third resin layer 233 is made of the first insulating material 241. The first insulating material 241 is formed of a resin material of which the coefficient of thermal expansion is smaller than that of the resin material forming the resin layers 21. Furthermore, in the present embodiment, the first insulating material 241 is formed of a resin material in which the modulus of elasticity is higher than for the resin material forming the resin layers 21.

As a result of the first insulating material 241 being formed of a resin material in which the coefficient of thermal expansion is smaller than for the resin layers 21, it is possible to ensure adhesion between the first end 11a and the first resin layer 212, and it is possible to prevent warping of the second substrate main body 20. In addition, as a result of the first insulating material 241 being formed of a resin material with a higher modulus of elasticity than the resin layers 21, the rigidity of the first insulating material 241 increases, and it is possible to improve the strength of the second substrate main body 20.

The material forming the first insulating material 241 is not particularly limited, and may be the same type of material as the resin material forming the resin layers 21, for example. In such a case, by increasing the filler content of the first insulating material 241 to higher than that of the resin layers 21, it is possible to form a first insulating material 241 in which the coefficient of thermal expansion is smaller and the modulus of elasticity is higher than those of the resin layers 21.

Meanwhile, the second insulating material 242 is formed of a material in which the modulus of elasticity is lower than that of the resin material forming the resin layers 21. As a result, bending stress applied to the periphery of the second substrate main body 20 is alleviated via the second insulating material 242; thus, it is possible to prevent the reinforcing member 23 from detaching from the housing section 213. In addition, the second insulating material 242 may be formed of a material in which the water absorption rate is lower than the water absorption rate of the resin layers 21. As a result, volume expansion or swelling due to the absorption of water by the second insulating material 242 is suppressed.

The material forming the second insulating material 242 is not particularly limited; however, a material that has a strong affinity toward the flexible wiring base board 11 is preferred, and example material is an epoxy, a polyimide, a liquid crystal polymer, a BT resin, PPS, or the like.

As mentioned above, the second insulating material 242 fills the space between the outer peripheral surface of the reinforcing member 23 and the inner peripheral surface of the housing section 213. It is not necessary for the second insulating material 242 to be provided along the entire outer peripheral surface of the reinforcing member 23, and the second insulating material 242 may be provided on at least one end of the second end 11b side of the flexible wiring base board 11. As a result, the second insulating material 242 can absorb or alleviate tensile stress or the like from the first substrate main body 10, and it is possible to suppress damage to the second substrate main body 20 and separation of the reinforcing section 12 from the first end 11a, for example.

In addition, the present invention is not limited to a case in which the entire area of the first end between the reinforcing member 23 and the housing section 213 is filled using the second insulating material 242, and, as shown in FIG. 2, a stacked section 243 of the first insulating material 241 and the second insulating material 242 may be provided. In such a case, it possible to provide both appropriate rigidity and appropriate elasticity in this region; thus, it is possible to increase the connection reliability between the flexible wiring base board 11 and the reinforcing section 12.

Note that, in accordance with the required characteristics, specifications, and the like, the second insulating material 242 may be omitted, and the first insulating material 241 may fill the space between the reinforcing member 23 and the housing section 213 in place of the second insulating material 242. In addition, as necessary, the stacked section 243 may be omitted, and the entire area of the first end may be filled using the first insulating material 241 or the second insulating material 242.

(Control Board)

The control board 30 corresponds to a main board on which an integrated circuit such as an IC, peripheral components of the integrated circuit, and the like are mounted, and is electrically connected to the second substrate main body 20 via the first substrate main body 10. The control board 30 is typically constituted of a bi-surface substrate in which the area is identical to or larger than that of the second substrate main body 20.

The control board 30 is formed of a stacked body constituted of the second end 11b of the flexible wiring base board 11, and multilayer wiring sections 31, 32 respectively disposed on both surfaces of the second end 11b. The multilayer wiring sections 31, 32 are typically manufactured using the build-up method. Interlayer insulating films forming the multilayer wiring sections 31, 32 may be formed of a glass epoxy material that has the rigidity, and in such a case, the control board 30 is formed as a rigid substrate.

In the circuit board 100 of the present embodiment that is configured as described above, the second substrate main body 20 has the plate-shaped reinforcing member 23 embedded in the first end 11a of the flexible wiring base board 11; thus, it is possible to improve the strength of the second substrate main body 20 as a result of the thickness of the first end 11a. Therefore, according to the present embodiment, it is possible to improve the strength of the second substrate main body 20 while satisfying the thickness demands for the second substrate main body 20.

Furthermore, according to the circuit board 100 of the present embodiment, since the metal reinforcing member 23 is embedded in the reinforcing section 12, it is possible to improve the heat-dissipating properties of electronic components mounted on the second substrate main body 20. Moreover, since the reinforcing member 23 is disposed near the first mounting surface S21 of the second substrate main body 20, it is possible to increase the heat-dissipating efficiency for electronic components mounted on the first mounting surface S21 (bottom face).

Figure 3:
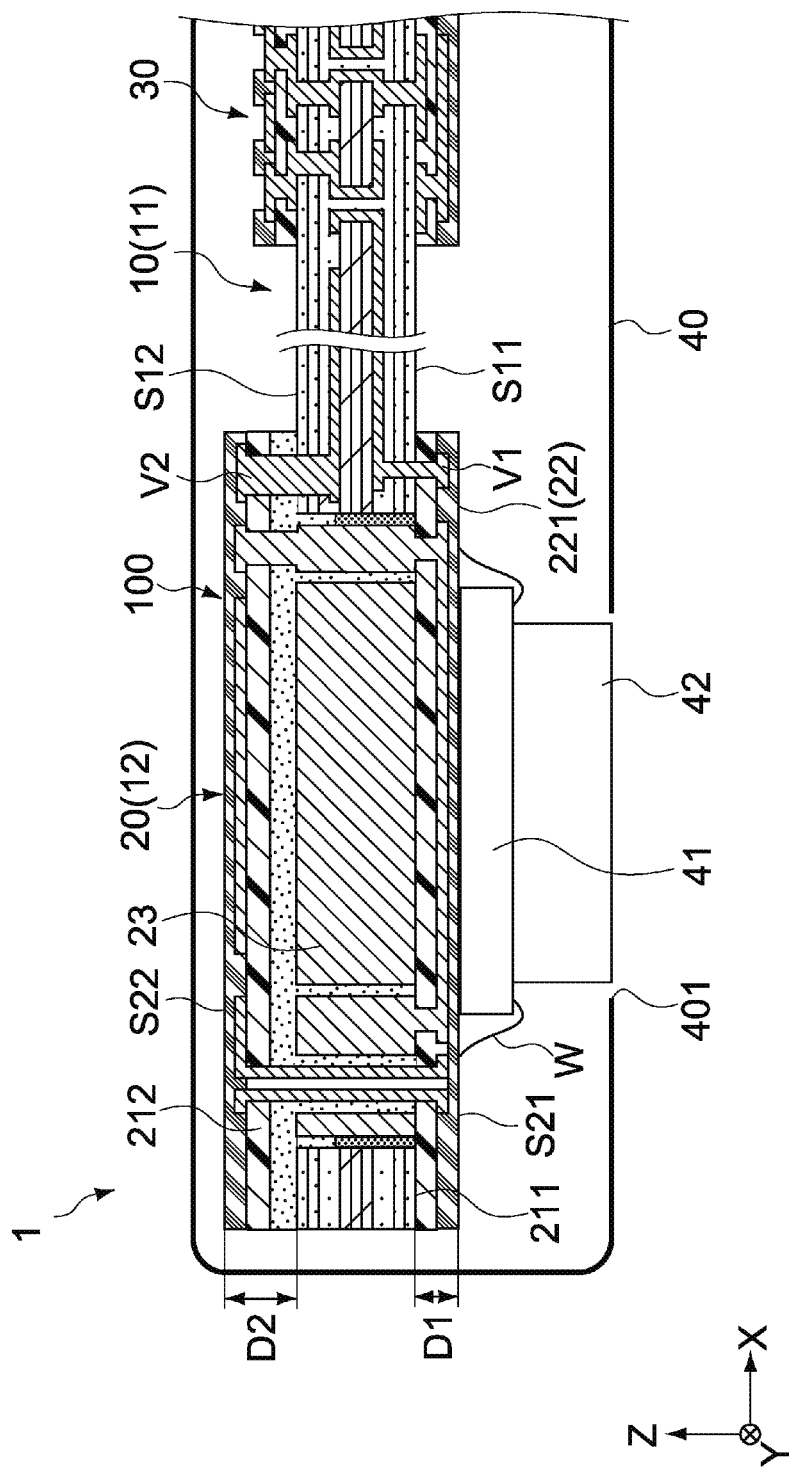

FIG. 3 is a schematic cross-sectional view that shows a configuration example of an electronic device 1 in which the circuit board 100 has been built in.

The electronic device 1 is constituted of a mobile information terminal with a camera, such as a smartphone, mobile telephone, or laptop personal computer, for example. The circuit board 100 is disposed inside a case 40 of the electronic device 1. A controller (not shown) of the electronic device 1 is connected to the control board 30 of the circuit board 100, and an imaging element 41, such as a CMOS (complementary metal oxide semiconductor) or a CCD (charge coupled device), is mounted on the second substrate main body 20. A lens barrel 42 is disposed on a light-receiving surface of the imaging element 41, and an opening 401 that exposes the lens barrel 42 to the exterior is provided in the case 40. The imaging element 41 is mounted on the first mounting surface S21 side of the reinforcing section 12 (the second substrate main body 20) of the circuit board 100 using the face-up method, and is electrically connected to the first wiring layer 221 via a plurality of holding wires W.

In the present embodiment, the reinforcing member 23 is disposed closer to the first mounting surface S21 than to the second mounting surface S22. Thus, a distance D1 between the reinforcing member 23 and the first mounting surface S21 that is the mounting surface for the imaging element 41 is smaller than a distance D2 between the second mounting surface S22 and the reinforcing member 23. Therefore, compared to case in which the imaging element 41 is mounted on the second mounting surface S22, the heat-dissipating properties of the imaging element 41 can be increased; thus, it is possible to stably ensure a desired picture quality by suppressing degradation of device characteristics due to heat even when operating the camera for a long period of time.

The size of the distance D1 between the imaging element 41 and the reinforcing member 23 is not particularly limited as long as it is larger than the distance D2, and may be 15 to 100 µm, for example. It is possible to appropriately set the distance D1 in accordance with the thickness of the first resin layer 211 and the insulating protective layer 25, and the like. An insulating interlayer with excellent thermal conductivity may be provided between the reinforcing member 23 and the first resin layer 211. As a result, it is possible to ensure the desired electrical insulating properties and heat-dissipating properties while decreasing the thickness of the first resin layer 211.

Moreover, since the reinforcing member 23 is disposed close to the mounting surface for the imaging element 41, it is easy to ensure the flatness (evenness) of the mounting surface. As a result, it is possible to stably mount the imaging element 41 on the reinforcing section 12; thus, it is possible to suppress variations in the optical axis of the imaging element 41.

Furthermore, since the flexible wiring base board 11 is disposed closer to the first mounting surface S21 than to the second mounting surface S22, it is possible, as shown in FIG. 2, to form the via V1, which electrically connects the first wiring layer 221 on the first mounting surface S21 side and the wiring layer 111 on the first primary surface S11 side of the flexible wiring base board 11, so as to be shallower than the via V2, which electrically connects the second wiring layer 222 on the second mounting surface S22 side and the wiring layer 112 on the second primary surface S12 side of the flexible wiring base board 11. Thus, the diameter of the via V1 becomes smaller than the diameter of the via V2, and it is possible to form the via V1 so as to be more dense than the via V2. As a result, in a case that the first mounting surface S21 is configured as the mounting surface for the imaging element 41 like in Embodiment 1, it is possible to sufficiently accommodate the electrode pitch of the imaging element 41 as well.

To give an example, in a case in which the aspect ratio (via diameter/via depth) of the via V1, V2 is set to 0.5 to 1, the via diameter becomes 50 to 100 µm when the depth of the via V1 is 50 µm, with the space and the clearance of a padding section being added together there. Meanwhile, when the depth of the via V2 is 100 µm, the via diameter becomes 100 to 200 µm; thus, it is possible to form the via V1 at a wiring density roughly two times that of the via V2.

In order for the flexible wiring base board 11 to be disposed near the first mounting surface S21, the third resin layer 233 was provided between the second resin layer 212 and the second primary surface S12 of the first end 11a in the present embodiment. The present invention is not limited to this, however, and the flexible wiring base board 11 may be brought closer to the first mounting surface S21 by forming the second resin layer 212 thicker than the first resin layer 211.

Embodiment 2

Figure 4:
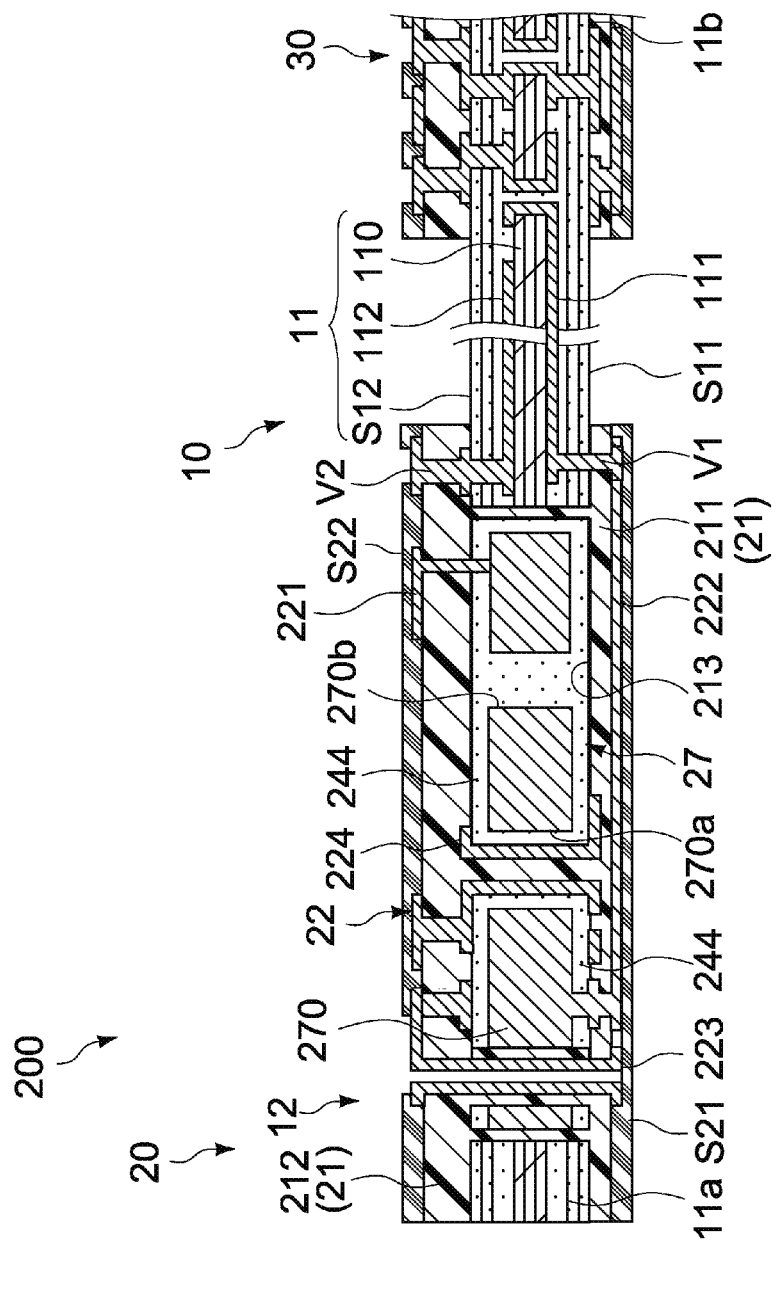
FIG. 4 is a schematic cross-sectional side view that shows a configuration of a circuit board according to Embodiment 2 of the present invention.

FIG. 4 is a schematic cross-sectional side view that shows a configuration of a circuit board according to Embodiment 2 of the present invention. Configurations differing from Embodiment 1 will be chiefly described below, and the same reference characters will be given for configurations that are the same as in Embodiment 1, with descriptions thereof being omitted or simplified.

A circuit board 200 of the present embodiment is the same as Embodiment 1 with respect to having the first substrate main body 10 and the second substrate main body 20; however, the present embodiment differs from Embodiment 1 in that a multilayer substrate 27 having a reinforcing member 270 as a core is embedded in the second substrate main body 20.

The reinforcing member 270 is constituted of a rectangular plate material that has a cavity 270b and penetrating holes 270a for forming the interlayer connecting section 223, and similar to Embodiment 1, is housed in the housing section 213 of the first end 11a. Although the cavity 270b is filled with the first insulating material 244, electronic components may be housed inside the cavity 270b. The type of electronic components is not particularly limited, and chip components such as capacitors, inductors, and resistors are typically used; however, in addition to these types of components, semiconductor chips such as ICs, and various types of sensor components can naturally be used.

Both surfaces of the reinforcing member 270 are covered using the first insulating material 244, and a third wiring layer 224 that is electrically connected to the circuit 22 (the first and second wiring layers 221, 222) is provided on the first insulating material 244. The third wiring layer 224 is formed using a metal film of copper or the like that has been patterned into a prescribed shape, and forms the interlayer connecting section that connects the various surfaces via the penetrating hole of the reinforcing member 270.

In the circuit board 200 of the present embodiment as well, the reinforcing member 270 and the first end 11a of the flexible wiring base board 11 are disposed closer to the first mounting surface S21 than to the second mounting surface S22 of the reinforcing section 12.

According to the circuit board 200 of the present embodiment configured in the above manner, it is possible to achieve operational effects similar to those of Embodiment 1 described above. In particular, according to the present embodiment, since the multilayer substrate 27 is embedded within the second substrate main body 20, it is possible to cause the second substrate main body 20 to have a higher functionality and to be able to mount components at a higher density.

Embodiments of the present invention were described above, but the present invention is not limited to the above-mentioned embodiments only, and various modifications can naturally be made.

For example, in the above-described embodiments, the planar shapes of the second substrate main body 20 and the reinforcing member 23 were both formed in a rectangular shape; however, the present invention is not limited to this, and the planar shapes of the second substrate main body 20 and the reinforcing member 23 may be formed in a polygon other than a rectangle, a circle, or another geometric shape.

The reinforcing member 23 forming the reinforcing section 12 is not limited to a metal plate-shaped member, and may be formed of a frame-shaped metal member. In such a case, it is possible to configure, as the circuit board, an element built-in substrate in which electronic components are housed in a hollow section (cavity) of the reinforcing member.

Furthermore, in the embodiments described above, the reinforcing member 23 and the first end 11a of the flexible wiring base board 11 are both disposed near the bottom face S21 (first mounting surface) of the reinforcing section 12; the present invention is not limited to this, however, and only the first end 11a of the flexible wiring base board 11 may be disposed near the bottom face S21 (first mounting surface) of the reinforcing section 12.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:
1. A circuit board, comprising:
a flexible wiring board having a plurality of layers laminated therein, including wiring layers and insulating layers, the wiring board having three sections arranged in a lengthwise direction of the wiring board: a first section in one end, a second section in a middle, and a third section in another end, the first section having a cavity or cutout in a plan view,
a metal reinforcing member embedded in the cavity or cutout of the wiring board in the first section;
a first resin layer that is formed on a bottom surface of the wiring board in the first section and that is selectively formed on a bottom of the reinforcement member, the first resin layer being absent on the wiring board in the second and third sections;
a second resin layer that is formed on a top surface of the wiring board in the first section and that selectively covers a top surface the reinforcement member, the second resin layer being absent on the wiring board in the second and third sections;
a first wiring layer that is provided on the first resin layer and that is electrically connected to the wiring board in the first section; and
a second wiring layer that is provided on the second resin layer and that is electrically connected to the wiring board in the first section,
wherein the metal reinforcing member has one of a plate shape and a frame shape in the plan view, and
wherein the first section of the wiring board is positioned closer to the first wiring layer than to the second wiring layer in the vertical direction.

2. The circuit board according to claim 1, wherein a thickness of the metal reinforcing member is smaller than a thickness of the wiring board.

3. The circuit board according to claim 1, wherein the metal reinforcing member is mounted in a bottomless cavity in the first section of the wiring board and is supported by the first resin layer that is exposed by the bottomless cavity.

4. The circuit board according to claim 1, wherein the metal reinforcing member is mounted in a bottomed cavity formed in the first section of the wiring board.

5. The circuit board according to claim 1, wherein the metal reinforcing member is electrically connected to the first wiring layer.

6. The circuit board according to claim 1, further comprising a third resin layer between the top surface of the metal reinforcing member and the second resin layer, the third resin layer being formed of a resin material having a smaller coefficient of thermal expansion than the second resin layer.

7. The circuit board according to claim 1, further comprising an insulating protective layer on the first wiring layer and an imaging device mounted on the insulating protective layer, the imaging device being electrically connected to the first wiring layer.

8. The circuit board according to claim 1, wherein the metal reinforcing member had a cavity or through hole, and the third resin layer also fills in the cavity or through hole in the metal reinforcing member.

9. The circuit board according to claim 1, wherein a multilayer substrate that includes the metal reinforcing member is embedded in the cavity or cutout of the wiring board in the first section.

10. A circuit board, comprising:
a flexible wiring board having a plurality of layers laminated therein, including wiring layers and insulating layers, the wiring board having three sections arranged in a lengthwise direction of the wiring board: a first section in one end, a second section in a middle, and a third section in another end, the first section having a cavity or cutout in a plan view,
a metal reinforcing member embedded in the cavity or cutout of the wiring board in the first section;
a first resin layer that is formed on a bottom surface of the wiring board in the first section and that is selectively formed on a bottom of the reinforcement member, the first resin layer being absent on the wiring board in the second and third sections;
a second resin layer that is formed on a top surface of the wiring board in the first section and that selectively covers a top surface the reinforcement member, the second resin layer being absent on the wiring board in the second and third sections;
a third resin layer between the top surface of the metal reinforcing member and the second resin layer, the third resin layer being formed of a resin material having a smaller coefficient of thermal expansion than the second resin layer;
a first wiring layer that is provided on the first resin layer and that is electrically connected to the wiring board in the first section;
a second wiring layer that is provided on the second resin layer and that is electrically connected to the wiring board in the first section;
a third resin layer that is formed on a bottom surface of the wiring board in the third section, the third resin layer being absent on the wiring board in the first and second sections;
a fourth resin layer that is formed on a top surface of the wiring board in the third section, the fourth resin layer being absent on the wiring board in the second and third sections;
a third wiring layer that is provided on the third resin layer and that is electrically connected to the wiring board in the third section; and
a fourth wiring layer that is provided on the fourth resin layer and that is electrically connected to the wiring board in the third section,
wherein the metal reinforcing member has one of a plate shape and a frame shape in the plan view, and
wherein the first section of the wiring board is positioned closer to the first wiring layer than to the second wiring layer in a vertical direction.

* * * * *